US012575233B2

(12) United States Patent
Li et al.

(10) Patent No.: US 12,575,233 B2
(45) Date of Patent: Mar. 10, 2026

(54) DISPLAY PANEL AND AN ELECTRONIC DEVICE

(71) Applicants: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

(72) Inventors: Zhuhui Li, Huizhou (CN); Minggang Liu, Huizhou (CN)

(73) Assignees: HUIZHOU CHINA STAR OPTOELECTRONICS DISPLAY CO., LTD., Huizhou (CN); SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 1038 days.

(21) Appl. No.: 17/618,425

(22) PCT Filed: Oct. 12, 2021

(86) PCT No.: PCT/CN2021/123324
§ 371 (c)(1),
(2) Date: Dec. 10, 2021

(87) PCT Pub. No.: WO2023/044985
PCT Pub. Date: Mar. 30, 2023

(65) Prior Publication Data
US 2024/0014362 A1      Jan. 11, 2024

(30) Foreign Application Priority Data

Sep. 24, 2021     (CN) ........................... 202111122207.2

(51) Int. Cl.
*H10H 20/857*       (2025.01)
*H01L 25/075*       (2006.01)
(Continued)

(52) U.S. Cl.
CPC ....... *H10H 20/857* (2025.01); *H01L 25/0753* (2013.01); *H01L 25/167* (2013.01); *H10H 29/39* (2025.01); *H10H 29/49* (2025.01)

(58) Field of Classification Search
CPC .... H10K 59/1315; H10H 29/39; H10H 29/49; H01L 25/0753
See application file for complete search history.

(56) References Cited

U.S. PATENT DOCUMENTS

2013/0201169 A1     8/2013   Ahn
2015/0372072 A1     12/2015  Xiong et al.

FOREIGN PATENT DOCUMENTS

CN          107910352 A        4/2018
CN          107978622 A        5/2018
(Continued)

OTHER PUBLICATIONS

English Translation of Chinese Publication Cn 107910352A. Translation conducted on Apr. 1, 2025. (Year: 2025).*
(Continued)

*Primary Examiner* — Amar Movva
(74) *Attorney, Agent, or Firm* — PV IP PC; Christopher S. Ruprecht; Wei Te Chung

(57)          ABSTRACT

The present disclosure provides a display panel and an electronic device, the display panel comprises a substrate and a plurality of light-emitting units, a plurality of power wires, and an auxiliary electrode disposed on the substrate; the power wires extend in a first direction, and are disposed between adjacent light-emitting units, and the power wires are connected to the light-emitting units; and the auxiliary electrode disposed on a surface of the power wires close to or away from the substrate; the power wires comprise a plurality of wire segments, each of the wire segments corresponds to one of the light-emitting units, and each of the wire segments is connected to the auxiliary electrode.

20 Claims, 9 Drawing Sheets

(51) Int. Cl.
  H01L 25/16        (2023.01)
  H10H 29/39        (2025.01)
  H10H 29/49        (2025.01)

(56)            References Cited

FOREIGN PATENT DOCUMENTS

| CN | 109166886 | A  | 1/2019 |
| CN | 111081720 | A  | 4/2020 |
| WO | 2021143846 | A1 | 7/2021 |

OTHER PUBLICATIONS

International Search Report in International application No. PCT/CN2021/123324,mailed on Jun. 22, 2022.
Written Opinion of the International Search Authority in International application No. PCT/CN2021/123324,mailed on Jun. 22, 2022.
Chinese Office Action issued in corresponding Chinese Patent Application No. 202111122207.2 dated Mar. 5, 2025, pp. 1-10.

\* cited by examiner

100

X
Y 10
11
12
13
121
141

17
16
15

13

X

Y

131

100

X
↑
└→Y 10
11
13

12
18  } 20

121
141

17
16
15

DISPLAY PANEL AND AN ELECTRONIC DEVICE

BACKGROUND OF INVENTION

Field of Invention

The present application relates to the field of display technology, and more particularly to a display panel and an electronic device.

Description of Prior Art

The display panel provides power signal required for normal operation to pixels in a plane through power wires to realize a picture display function. However, due to the resistance of the power wire, from the end close to the driving chip to the end away from the driving chip, the impedance of the power wires increases, an obvious ohmic voltage drop (IR drop) will occur on the power wires during the transmission of the power signal, resulting in uneven brightness of the display panel, the display quality of the display panel is reduced.

SUMMARY OF INVENTION

The embodiments of the present application provide a display panel and an electronic device to reduce the IR drop of the power wires and improve the brightness uniformity of the display panel.

The present application provides a display panel, which comprises:

a substrate;

a plurality of light-emitting units disposed on the substrate;

a plurality of power wires disposed on the substrate, the power wires extend in a first direction and are disposed between adjacent light-emitting units, and the power wires are connected to the light-emitting units; and an auxiliary electrode disposed on a surface of the power wires close to or away from the substrate, wherein, the power wires comprise a plurality of wire segments, each of the wire segments corresponds to one of the light-emitting units, and each of the wire segments is connected to the auxiliary electrode.

In the display panel of the present application, the display panel further comprises an insulating layer, the insulating layer disposed between the power wires and the auxiliary electrode, a through hole is disposed in the insulating layer, and the wire segments and the auxiliary electrode are connected in the through hole.

In the display panel of the present application, an opening area of the through hole gradually increases along the first direction.

In the display panel of the present application, an entire surface of the auxiliary electrode is disposed on the substrate.

In the display panel of the present application, a plurality of openings are disposed in the auxiliary electrode, an extension direction of the openings is perpendicular to the first direction, and a distance between two adjacent openings gradually increases along the first direction.

In the display panel of the present application, the display panel further comprises a plurality of auxiliary power wires disposed on the substrate, and a plurality of the auxiliary power wires intersect with a plurality of the power wires to form a mesh structure, the wire segments and the auxiliary electrode are connected in an area where the auxiliary power wires and the power wires intersect.

In the display panel of the present application, the display panel further comprises a driving chip, the driving chip is connected to a surface of the substrate, and the power wires and the auxiliary electrode are both connected to the driving chip.

In the display panel of the present application, a plurality of the power wires comprise a plurality of first power wires and a plurality of second power wires disposed on the substrate, and the first power wires are located on a surface of the second power wires close to the substrate, the first power wires and the second power wires both extend along the first direction and are disposed between adjacent light-emitting units;

the driving chip comprises a first driving chip and a second driving chip, the first driving chip and the second driving chip are both connected to a surface of the substrate; the auxiliary electrode comprises a first auxiliary electrode and a second auxiliary electrode, the first auxiliary electrode is located between the substrate and the first power wires, and the second auxiliary electrode is located on a surface of the second power wires away from the substrate; the first power wires and the first auxiliary electrode are both connected to the first driving chip, and the second power wires the second auxiliary electrode are both connected to the second driving chip;

wherein the first power wires comprise a plurality of first wire segments, the second power wires comprise a plurality of second wire segments, and each of the first wire segments and each of the second wire segments are corresponding to one of the light-emitting units, and each of the first wire segments is connected to the first auxiliary electrode, and each of the second wire segments is connected to the second auxiliary electrode.

In the display panel of the present application, the display panel further comprises a first insulating layer and a second insulating layer, the first insulating layer is located between the first auxiliary electrode and the first power wire, and the second insulating layer is located between the second power wires and the second auxiliary electrode; and a first through hole is disposed in the first insulating layer, and the first wire segments and the first auxiliary electrode are connected in the first through hole; a second through hole is disposed in the second insulating layer, the second wire segments and the second auxiliary electrode are connected in the second through hole.

In the display panel of the present application, the first power wires are positive polarity power wires, and the second power wires are negative polarity power wires; and/or the display panel further comprises a plurality of first auxiliary power wires and a plurality of second auxiliary power wires disposed on the substrate; a plurality of the first auxiliary power wires intersect with a plurality of the first power wires to form a first mesh structure, and a plurality of the second auxiliary power wires intersect with a plurality of the second power wires to form a second mesh structure.

The present application also provides an electronic device, which comprising a housing and a display panel disposed in the housing, and the display panel comprises:

a substrate;

a plurality of light-emitting units disposed on the substrate;

a plurality of power wires disposed on the substrate, the power wires extend in a first direction and are disposed between adjacent light-emitting units, and the power wires are connected to the light-emitting units; and an auxiliary electrode; disposed on a surface of the power wires close to or away from the substrate, wherein, the power wires comprise a plurality of wire segments, each of the wire segments corresponds to one of the light-emitting units, and each of the wire segments is connected to the auxiliary electrode.

In the electronic device of the present application, the display panel further comprises an insulating layer, the insulating layer disposed between the power wires and the auxiliary electrode, a through hole is disposed in the insulating layer, and the wire segments and the auxiliary electrode are connected in the through hole.

In the electronic device of the present application, an opening area of the through hole gradually increases along the first direction.

In the electronic device of the present application, an entire surface of the auxiliary electrode is disposed on the substrate.

In the electronic device of the present application, a plurality of openings are disposed in the auxiliary electrode, an extension direction of the openings is perpendicular to the first direction, and a distance between two of adjacent openings gradually increases along the first direction.

In the electronic device of the present application, the display panel further comprises a plurality of auxiliary power wires disposed on the substrate, and a plurality of the auxiliary power wires intersect with a plurality of the power wires to form a mesh structure, the wire segments and the auxiliary electrode are connected in an area where the auxiliary power wires and the power wires intersect.

In the electronic device of the present application, the display panel further comprises a driving chip, the driving chip is connected to a surface of the substrate, and the power wires and the auxiliary electrode are both connected to the driving chip.

In the electronic device of the present application, a plurality of the power wires comprise a plurality of first power wires and a plurality of second power wires disposed on the substrate, and the first power wires are located on a surface of the second power wires close to the substrate, the first power wires and the second power wires both extend along the first direction and are disposed between adjacent light-emitting units;

the driving chip comprises a first driving chip and a second driving chip, the first driving chip and the second driving chip are both connected to a surface of the substrate, the auxiliary electrode comprises a first auxiliary electrode and a second auxiliary electrode, the first auxiliary electrode is located between the substrate and the first power wires, and the second auxiliary electrode is located on a surface of the second power wires away from the substrate; the first power wires and the first auxiliary electrode are both connected to the first driving chip, and the second power wires the second auxiliary electrode are both connected to the second driving chip;

wherein, the first power wires comprise a plurality of first wire segments, the second power wires comprise a plurality of second wire segments, and each of the first wire segments and each of the second wire segments are corresponding to one of the light-emitting units, and each of the first wire segments is connected to the first auxiliary electrode, and each of the second wire segments is connected to the second auxiliary electrode.

In the electronic device of the present application, the display panel further comprises a first insulating layer and a second insulating layer, the first insulating layer is located between the first auxiliary electrode and the first power wire, and the second insulating layer is located between the second power wires and the second auxiliary electrode; and a first through hole is disposed in the first insulating layer, and the first wire segments and the first auxiliary electrode are connected in the first through hole; a second through hole is disposed in the second insulating layer, the second wire segments and the second auxiliary electrode are connected in the second through hole.

In the electronic device of the present application, the first power wires are positive polarity power wires, and the second power wires are negative polarity power wires; and/or the display panel further comprises a plurality of first auxiliary power wires and a plurality of second auxiliary power wires disposed on the substrate; a plurality of the first auxiliary power wires intersect with a plurality of the first power wires to form a first mesh structure, and a plurality of the second auxiliary power wires intersect with a plurality of the second power wires to form a second mesh structure.

Advantageous Effects

Comparing with the display panel in the prior art, the display panel of the present application comprises a substrate and a plurality of light-emitting units, a plurality of power wires and an auxiliary electrode disposed on the substrate, the power wires extend in a first direction and are disposed between adjacent light-emitting units, and the power wires are connected to the light-emitting units; and the power wires comprise a plurality of wire segments, each of the wire segments corresponds to one of the light-emitting units, and each of the wire segments is connected to the auxiliary electrode. In the present application, by providing the auxiliary electrode in the display panel, and the auxiliary electrode is connected to the wire segments of the power wires corresponding to each light-emitting unit, by using the auxiliary electrode as a parallel resistance of the power wires, the impedance of the power wires is reduced, and the voltage drop of the power wires during the signal transmission process is reduced, thereby improving the brightness uniformity of the display panel and improving the display quality of display panel.

BRIEF DESCRIPTION OF DRAWINGS

In order to more clearly illustrate the embodiments or the technical solutions of the existing art, the drawings illustrating the embodiments or the existing art will be briefly described below. The drawings in the following description merely illustrate some embodiments of the present application. Other drawings may also be obtained by those skilled in the art according to these figures without paying creative work.

5

Figure 3:
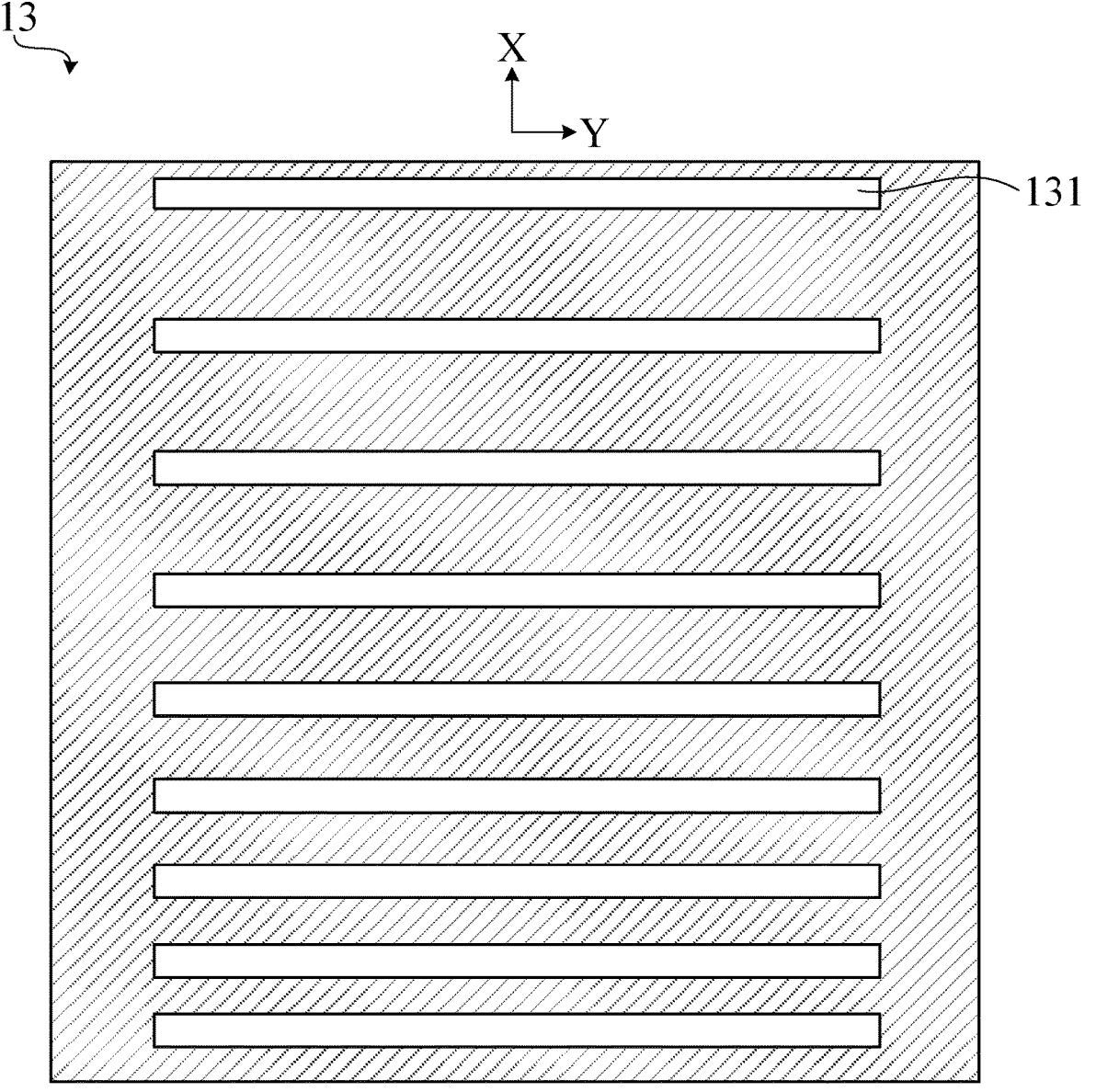

FIG. 3 is a schematic diagram of a planar structure of an auxiliary electrode in a display panel of a second embodiment of the present application.

Figure 4:
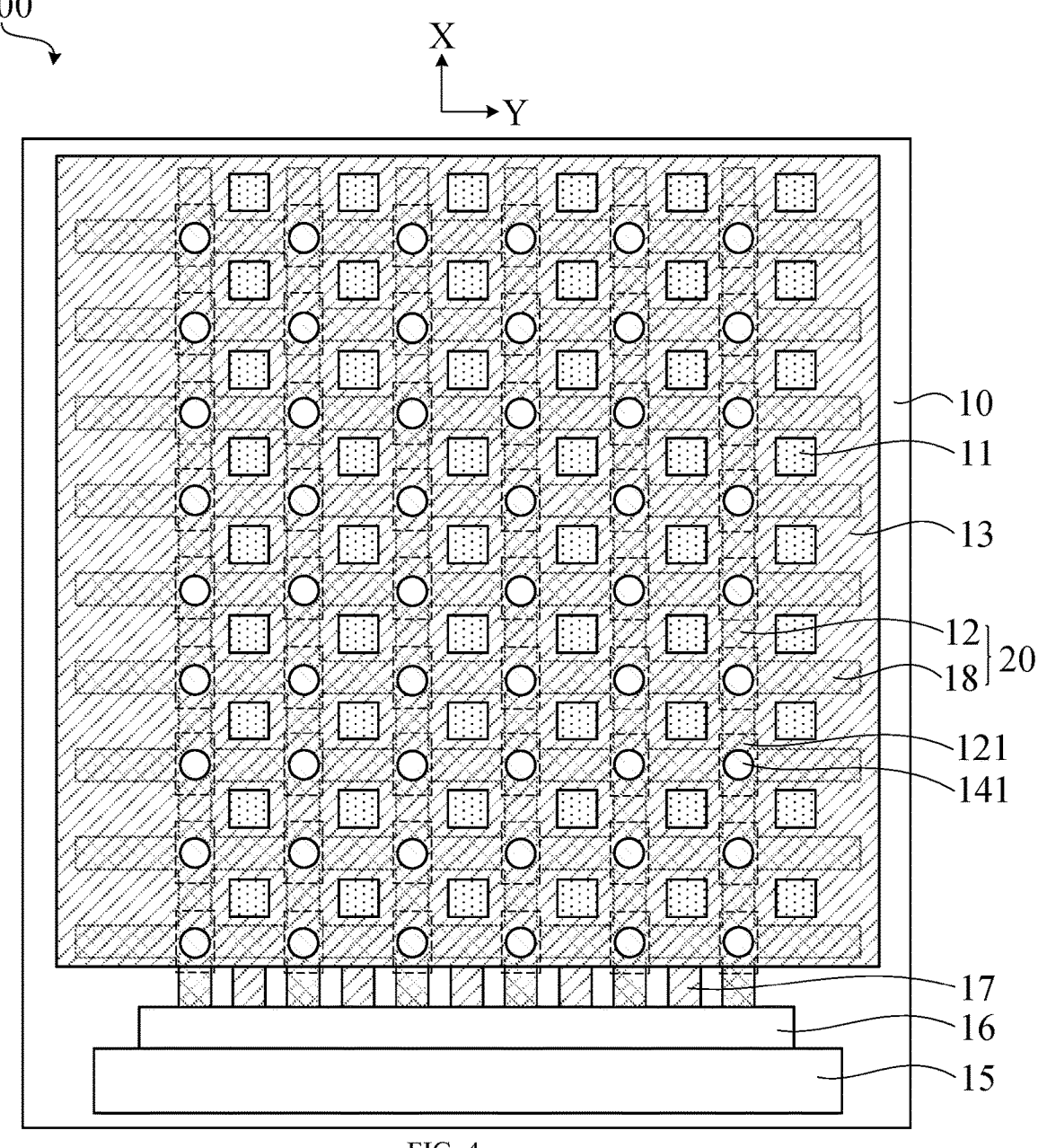

FIG. 4 is a schematic diagram of a planar structure of a display panel of a third embodiment of the present application.

Figure 5:
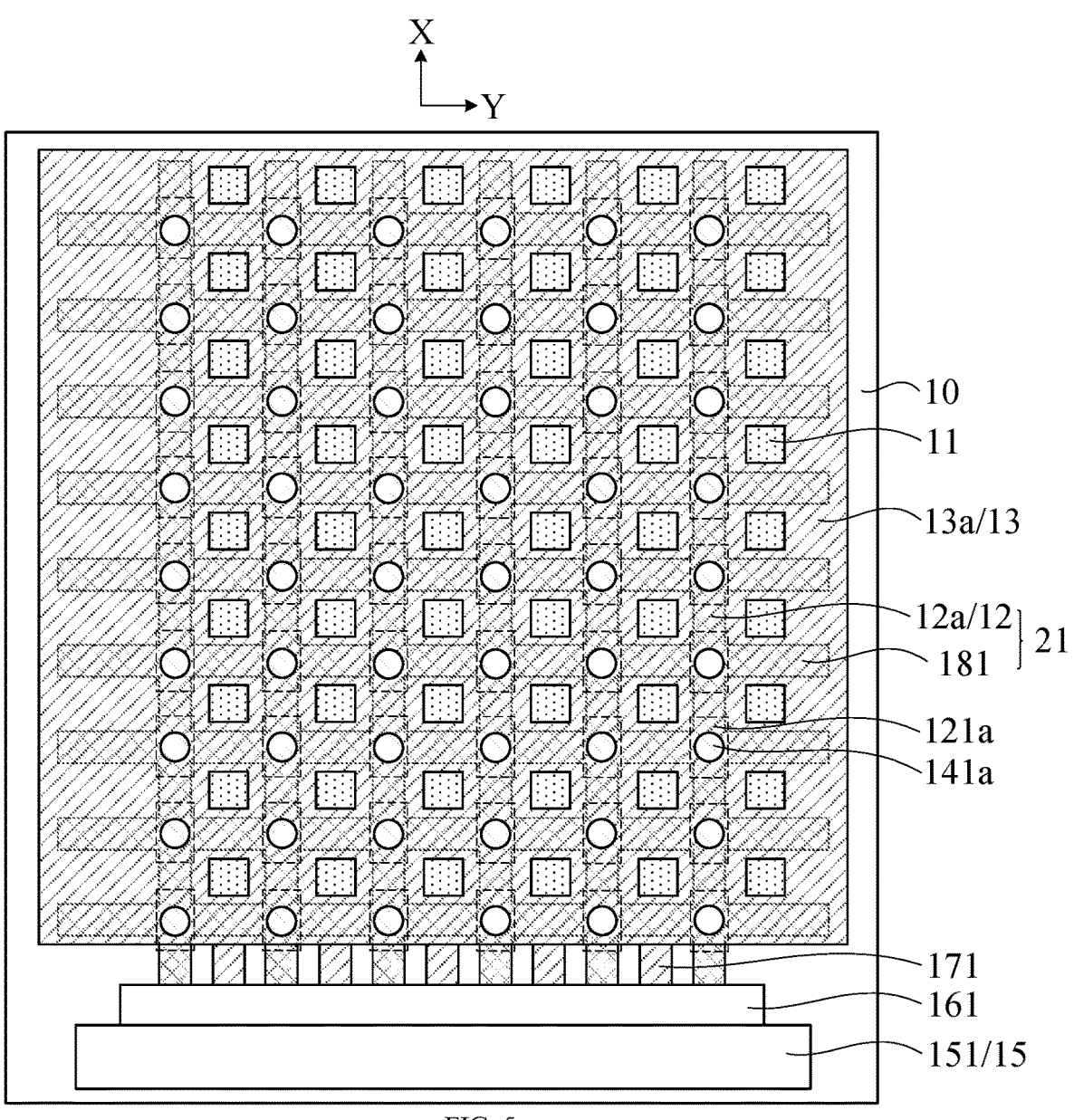

FIG. 5 is a schematic diagram of the connection structure between a first power wires and a first auxiliary electrode in the display panel of a fourth embodiment of the present application.

Figure 6:
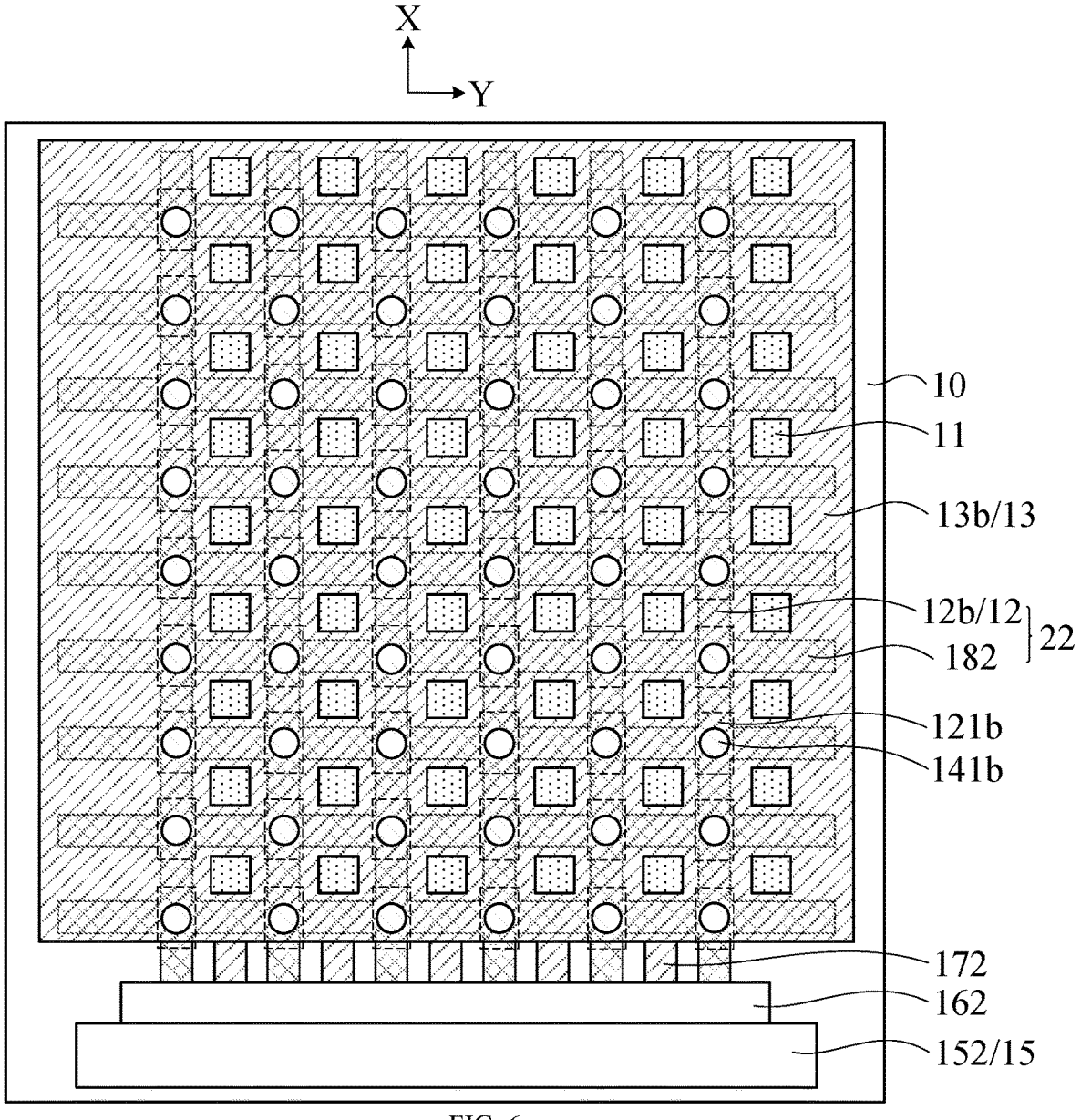

FIG. 6 is a schematic diagram of the connection structure between a second power wires and a second auxiliary electrode in the display panel of the fourth embodiment of the present application.

Figure 7:
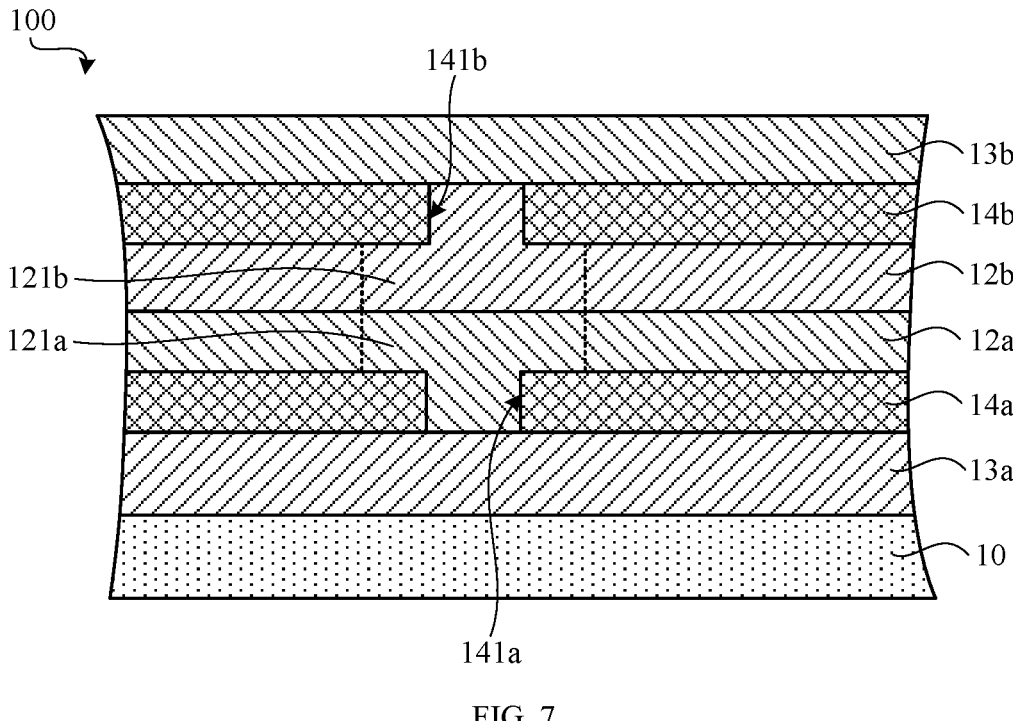

FIG. 7 is a schematic diagram of a cross-sectional structure of a display panel of the fourth embodiment of the present application.

FIG. 8A to 8F are schematic diagrams of a flow structure of a method for manufacturing the display panel of the fourth embodiment of the present application.

DETAILED DESCRIPTION OF PREFERRED EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in the present application, all other embodiments obtained by those skilled in the art without creative work shall fall within the protection scope of this application. In addition, it should be understood that the specific implementations described here are only used to illustrate and explain the application, and are not used to limit the present application. In the present application, if no explanation is made to the contrary, the orientation words used such as "upper" and "lower" generally refer to the upper and lower positions of the device in actual use or working state, and specifically refer to the drawing directions in the drawings; and "inner" and "outer" refer to the outline of the device.

An embodiment of the present application provides a display panel and an electronic device. Detailed descriptions are given below. It should be noted that the order of description in the following embodiments is not meant to limit the preferred order of the embodiments.

The present application provides a display panel, which comprises a substrate, a plurality of light-emitting units, a plurality of power wires, and an auxiliary electrode disposed on the substrate. The power wires extend in a first direction and are disposed between adjacent light-emitting units, and the power wires are connected to the light-emitting units; the auxiliary electrode disposed on a surface of the power wires close to or away from the substrate; wherein, the power wires comprise a plurality of wire segments, each of the wire segments corresponding to one light-emitting unit, and each of the wire segments is connected to the auxiliary electrode.

Therefore, in the present application, by providing the auxiliary electrode in the display panel, the auxiliary electrode connected to the wire segments of the power wires corresponding to each light-emitting unit, by using the auxiliary electrode as a parallel resistance of the power wires, the impedance of the power wires is reduced, and the voltage drop of the power wires during the signal transmission process is reduced, thereby improving the brightness uniformity of the display panel and improving display quality of the display panel.

The display panel provided in the present application will be described in detail below through specific embodiments.

Figure 1:
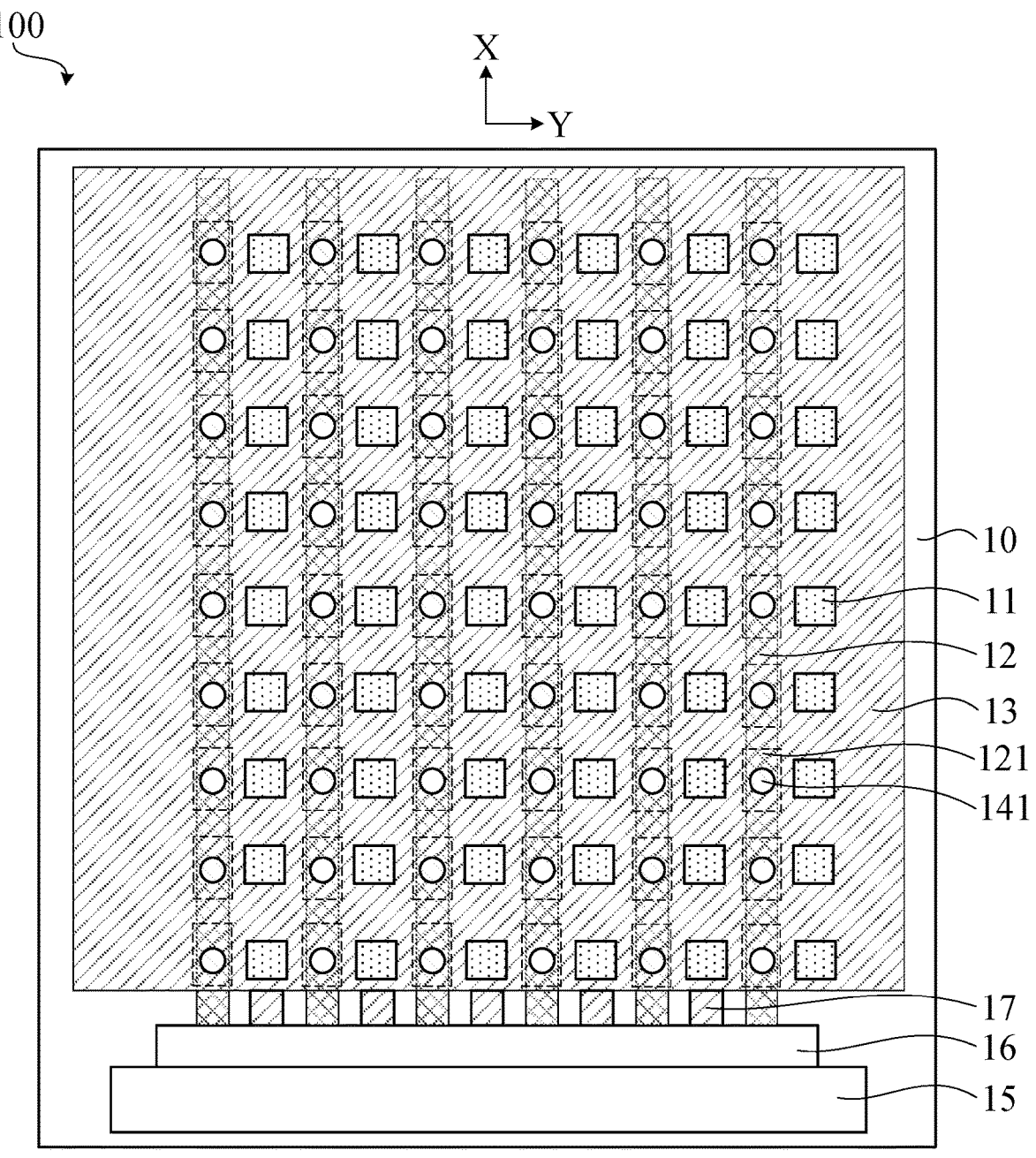
FIG. 1 is a schematic diagram of a planar structure of a display panel of a first embodiment of the present application.
Figure 2:
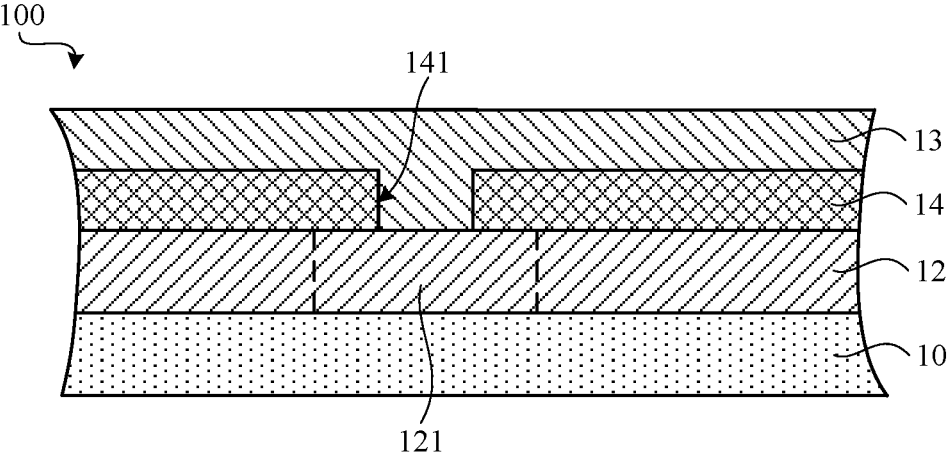
FIG. 2 is a schematic diagram of a cross-sectional structure of a display panel of the first embodiment of the present application.

Please refer to FIG. 1 and FIG. 2, a first embodiment of the present application provides a display panel 100. Display panel 100 comprises a substrate 10, a plurality of light-emitting units 11, a plurality of power wires 12, and an auxiliary electrode 13, all disposed on the substrate 10. The power wires 12 extend in a first direction X. The power wires 12 disposed between adjacent light-emitting units 11. And the power wires 12 are connected to the light-emitting units 11. The auxiliary electrode 13 disposed on a surface of the power wires 12 away from the substrate 10. The power wires 12 comprise a plurality of wire segments 121, each of the wire segments 121 corresponds to one light-emitting unit 11. Each of the wire segments 121 is connected to the auxiliary electrode 13.

It should be noted that in the present application, the auxiliary electrode 13 can also disposed on a surface of the power wires 12 close to the substrate 10. In the embodiment, only the auxiliary electrode 13 disposed on the surface of the power wires 12 away from the substrate 10 as an example, but it is not limited to this.

The substrate 10 may be a rigid substrate, such as a glass substrate; or the substrate 10 may also be a flexible substrate, such as a polyimide substrate.

The light-emitting units 11 disposed in an array. In some embodiments, when the display panel 100 has a special-shaped display, the light-emitting units 11 may also disposed irregularly. The arrangement structure of the light-emitting units 11 can be set according to actual conditions, which is not limited in this application. Wherein, the light-emitting units 11 may be an organic light-emitting diode, a micro light-emitting diode, or a mini light-emitting diode. It should be noted that the specific structure of the light-emitting units 11 in the present application can refer to the prior art, which will not be repeated here.

In the first direction X, the plurality of light-emitting units 11 are connected to one of the power wires 12. Wherein, the power wires 12 may be a positive polarity power wires (VDD signal wire) or a negative polarity power wires (VSS signal wire). Each of the power wires 12 includes a plurality of wire segments 121. The plurality of wire segments 121 arranged along the first direction X. The plurality of wire segments 121 disposed at intervals or connected to each other. Each of the wire segments 121 corresponds to one light-emitting unit 11. The auxiliary electrode 13 is connected to the wire segments 121 corresponding to each of light-emitting units 11.

Combining FIG. 1 and FIG. 2, the display panel 100 further comprises an insulating layer 14. The insulating layer 14 disposed between the power wires 12 and the auxiliary electrode 13. Wherein, the material of the insulating layer 14 may be an organic material, such as organic resin. A through hole 141 is disposed in the insulating layer 14. The wire segments 121 and the auxiliary electrode 13 are connected in the through hole 141.

In the embodiment, the auxiliary electrode 13 disposed on the substrate 10 over the entire surface. Specifically, an orthographic projection of the auxiliary electrode 13 on a plane of the substrate 10 completely covers an orthographic projection of the power wires 12 on the plane of the substrate 10. On the one hand, the above arrangement does not require patterning of the auxiliary electrode 13, which simplifies the difficulty of the process operation. On the other hand, when the auxiliary electrode 13 has a whole surface structure, the cross-sectional area of the auxiliary electrode 13 on a plane parallel to the substrate 10 is maximized, the parallel resistance value formed by the auxiliary electrode 13 and the wire segments 121 can be reduced, so that an ohmic resistance drop (IR drop) on the power wires 12 can be further reduced, and the brightness uniformity of the display panel 100 can be further improved.

The display panel 100 further comprises a driving chip 15. The driving chip 15 is connected to a surface of the substrate 10. The power wires 12 and the auxiliary electrode 13 are both connected to the driving chip 15. When ends of the power wires 12 and of the auxiliary electrode 13, close to the driving chip 15, are connected to a power supply voltage from the driving chip 15, a power signal will be transmitted in the power wires 12 and the auxiliary electrode 13 at a same time. Although, in the first direction X, as the impedance of the power wires 12 increases, the power supply voltage will be lost during transmission and produce IR drop, but the wire segments 121 of the power wires 12 are connected to the auxiliary electrode 13, therefore, the power supply voltage in the auxiliary electrode 13 will compensate the power supply voltage at each of the wire segments 121, that is, the auxiliary electrode 13 will compensate the power supply voltage input by the light-emitting units 11 corresponding to each of the wire segments 121, so that the power supply voltage of each pixel is compensated, so as to compensate for the IR drop of the power wires 12 during signal transmission, and the brightness uniformity of the display panel 100 can be further improved.

Specifically, the display panel 100 further includes a power bus 16 and a connection wire 17 disposed on the substrate 10. The power bus 16 is connected between the driving chip 15 and the power wires 12, and is used to transmit the power signal in the driving chip 15 to the power wires 12 and the auxiliary electrode 13. The power bus 16 extends in a second direction Y. The second direction Y is perpendicular to the first direction X. The connection wire 17 is connected between the power bus 16 and the auxiliary electrode 13 for transmitting the power signal in the power bus 16 to the auxiliary electrode 13. The connection wire 17 extends along the first direction X. An orthographic projection of the connection wire 17 on the plane of the substrate 10 are located between orthographic projections of adjacent power wires 12 on the plane of the substrate 10.

In the embodiment, an area of openings 131 of the through holes 141 are same. Since the wire segments 121 of the power wires 12 and the auxiliary electrode 13 are connected in the through hole 141, therefore, the above arrangement allows each of wire segments 121 and the auxiliary electrode 13 to have a same contact area, thereby the overall IR drop of the display panel 100 is uniformly reduced, so that the overall brightness of the display panel 100 can be improved. In some embodiments, an opening area of the through hole 141 gradually increases along the first direction X, and this arrangement causes the contact area between the wire segments 121 and the auxiliary electrode 13 along the first direction X to gradually increase, thereby it can match the gradual decrease of the IR drop in the first direction X, so that the difference between the IR drop on a surface close to the driving chip 15 and a surface away from the driving chip 15 can be further reduced.

It should be noted that the display panel 100 may be an organic light-emitting diode display panel, a micro light-emitting diode display panel, or a mini light-emitting diode display panel, and the specific type of the display panel 100 is not limited in this application.

Please refer to FIG. 3, a second embodiment of the present application provides a display panel 100. The difference between the display panel 100 provided in the second embodiment and the first embodiment is: a plurality of openings 131 are disposed in the auxiliary electrode 13, an extension direction of the openings 131 is perpendicular to the first direction X, a distance between two adjacent openings 131 gradually increases along the first direction X. In the first direction X, the opening 131 is located between two or more adjacent through holes 141.

It should be noted that in the embodiment, the openings 131 completely penetrates the auxiliary electrode 13. In some embodiments, the openings 131 may also partially penetrate the auxiliary electrode 13, which will not be repeated here.

In the embodiment, the auxiliary electrode 13 is hollowed out, so that a cross-sectional area of the auxiliary electrode 13 gradually increases along the first direction X, in turn, the parallel resistance value formed between the auxiliary electrode 13 and the power wires 12 gradually decreases along the first direction X, so that the IR drop reduction value of the power wires 12 on the surface close to the driving chip 15 is less than the IR drop reduction value on the surface away from the driving chip 15. Thereby, the difference of the IR drop on the power wires 12 can be reduced, and the brightness uniformity of the display panel 100 can be further improved.

It should be noted that, the embodiment only illustrates the structure of the auxiliary electrode 13 in the display panel 100. For other structures in the display panel 100, reference may be made to the description of the foregoing first embodiment, which will not be repeated here.

Please refer to FIG. 4, a third embodiment of the present application provides a display panel 100. The difference between the display panel 100 provided in the third embodiment and the first embodiment is: the display panel 100 further comprises a plurality of auxiliary power wires 18 disposed on the substrate 10, and a plurality of the auxiliary power wires 18 intersect with a plurality of the power wires 12 to form a mesh structure 20, the wire segments 121 are connected to the auxiliary electrode 13 in an area where the auxiliary power wires 18 and the power wires 12 intersect, and the through hole 141 is disposed in an area where the auxiliary power wires 18 and the power wires 12 intersect.

Please refer to FIG. 5 to FIG. 7, a fourth embodiment of the present application provides a display panel 100. Display panel 100 comprises a substrate 10, a plurality of light-emitting units 11, a plurality of power wires 12 and an auxiliary electrode 13, all disposed on the substrate 10. The power wires 12 extend in a first direction X. The power wires 12 disposed between adjacent light-emitting units 11. And the power wires 12 are connected to the light-emitting units 11. The auxiliary electrode 13 disposed on a surface of the power wires 12 close to or away from the substrate 10. The power wires 12 comprise a plurality of wire segments 121, each of the wire segments 121 corresponds to one light-emitting unit 11. Each of the wire segments 121 is connected to the auxiliary electrode 13.

It should be noted that in the present application, the display panel 100 may be an organic light-emitting diode display panel, a micro light-emitting diode display panel, or a mini light-emitting diode display panel. In the embodiment, the display panel 100 is a micro light-emitting diode display panel as an example for description, but it is not limited to this.

Specifically, the substrate 10 may be a rigid substrate, such as a glass substrate; or the substrate 10 may also be a flexible substrate, such as a polyimide substrate.

The light-emitting units 11 disposed in an array. In some embodiments, when the display panel 100 has a special-shaped display, the light-emitting units 11 may also disposed irregularly. The arrangement structure of the light-emitting units 11 can be set according to actual conditions, which is not limited in this application. Wherein, the light-emitting units 11 may be an organic light-emitting diode, a micro light-emitting diode, or a mini light-emitting diode. It should be noted that the specific structure of the light-emitting units 11 in the present application can refer to the prior art, which will not be repeated here.

A plurality of the power wires 12 comprise a plurality of first power wires 12a and a plurality of second power wires 12b disposed on the substrate 10. The first power wires 12a are located on a surface of the second power wires 12b close to the substrate 10. The first power wires 12a and the second power wires 12b both extend along a first direction X. The first power wires 12a and the second power wires 12b both disposed between adjacent light-emitting units 11. In the first direction X, the plurality of light-emitting units 11 are respectively connected to the first power wires 12a and the second power wires 12b.

In the embodiment, the first power wires 12a are positive polarity power wires (VDD signal wires). The second power wires 12b are negative polarity power wires (VSS signal wires). In some embodiments, the first power wires 12a may also be VSS signal wires, and the second power wires 12b are a VDD signal wires, which is not limited in this application.

The auxiliary electrode 13 comprises a first auxiliary electrode 13a and a second auxiliary electrode 13b. The first auxiliary electrode 13a is located between the substrate 10 and the first power wires 12a. The second auxiliary electrode 13b is located on a surface of the second power wires 12b away from the substrate 10.

Each of the first power wires 12a includes a plurality of first wire segments 121a. The plurality of first wire segments 121a disposed at intervals or connected to each other. The plurality of first wire segments 121a arranged along the first direction X. Each of the first wire segments 121a corresponds to one light-emitting unit 11. The first auxiliary electrode 13a is connected to the first wire segments 121a corresponding to one of the light-emitting units 11. The display panel 100 further includes a first insulating layer 14a. The first insulating layer 14a is located between the first auxiliary electrode 13a and the first power wires 12a. The first through hole 141a is disposed in the first insulating layer 14a. The first wire segments 121a and the first auxiliary electrode 13a are connected in the first through hole 141a.

Each of the second power wires 12b includes a plurality of second wire segments 121b. The plurality of second wire segments 121b disposed at intervals or connected to each other. The plurality of second wire segments 121b arranged along the first direction X. Each of the second wire segments 121b corresponds to one light-emitting unit 11. The second auxiliary electrode 13b is connected to the second wire segments 121b corresponding to each of the light-emitting units 11. The display panel 100 further includes a second insulating layer 14b. The second insulating layer 14b is located between the second auxiliary electrode 13b and the second power wires 12b. A second through hole 141b is disposed in the second insulating layer 14b. The second wire segments 121b and the second auxiliary electrode 13b are connected in the second through hole 141b.

It should be noted that in the embodiment, an area of openings 131 of the first through holes 141a in the first insulating layer 14a are same. An area of openings 131 of the second through holes 141b in the second insulating layer 14b are same. The above arrangement makes each first wire segments 121a and the first auxiliary electrode 13a, and each second wire segments 121b and the second auxiliary electrode 13b have a same contact area, thereby reducing the overall IR drop of the display panel 100 evenly. Therefore, the overall brightness of the display panel 100 can be improved.

As shown in FIG. 5 and FIG. 6, in the embodiment, the first auxiliary electrode 13a and the second auxiliary electrode 13b have a whole surface structure. Specifically, the orthographic projection of the first auxiliary electrode 13a on the plane of the substrate 10 completely covers the orthographic projection of the first power wires 12a on the plane of the substrate 10, and the orthographic projection of the second auxiliary electrode 13b on the plane of the substrate 10 completely covers the orthographic projection of the second power wires 12b on the plane of the substrate 10.

On the one hand, the above arrangement does not require patterning of the first auxiliary electrode 13a and the second auxiliary electrode 13b, which can simplify the difficulty of the process operation. On the other hand, when the first auxiliary electrode 13a and the second auxiliary electrode 13b are of a whole-surface structure, the cross-sectional area of the first auxiliary electrode 13a and the second auxiliary electrode 13b on the plane parallel to the substrate 10 is maximized, it is possible to reduce the parallel resistance value formed by the first auxiliary electrode 13a and the first wire segments 121a, and the parallel resistance value formed by the second auxiliary electrode 13b and the second wire segments 121b, thereby further reducing the IR drop of the first power wires 12a and the second power wires 12b.

In the embodiment, the display panel 100 further includes a driving chip 15. The driving chip 15 includes a first driving chip 151 and a second driving chip 152. Both the first driving chip 151 and the second driving chip 152 are connected to a surface of the substrate 10.

Wherein, the first power wires 12a and the first auxiliary electrode 13a are both connected to the first driving chip 151, when ends of the first power wires 12a and of the first auxiliary electrode 13a, close to the first driving chip 151, are connected to the VDD voltage from the first driving chip 151, the VDD signal will be simultaneously transmitted in the first power wires 12a and the first auxiliary electrode 13a. Although, in the first direction X, as the impedance of the first power wires 12a increases, the VDD voltage will be lost during the transmission process and produce IR drop, however, due to the first wire segments 121a in the first power wires 12a connected to the first auxiliary electrode 13a, therefore, the VDD voltage in the first auxiliary electrode 13a will compensate the VDD voltage at each first wire segments 121a, that is, the first auxiliary electrode 13a compensates for the VDD voltage input by the light-emitting units 11 corresponding to each of the first wire segments 121a, so as to compensate for the IR drop of the first power wires 12a during the VDD signal transmission process, and the brightness uniformity of the display panel 100 is improved.

The second power wires 12b and the second auxiliary electrode 13b are both connected to the second driving chip 152, when the ends of the second power wires 12b and of the second auxiliary electrode 13$b$, close to the second driving chip 152, are connected to the VSS voltage from the second driving chip 152, the VSS signal will be simultaneously transmitted in the second power wires 12$b$ and the second auxiliary electrode 13$b$. Although, in the first direction X, as the impedance of the second power wires 12$b$ increases, the VSS voltage will be lost during the transmission process and produce IR drop, however, due to the second wire segments 121$b$ in the second power wires 12$b$ connected to the second auxiliary electrode 13$b$, therefore, the VSS voltage in the second auxiliary electrode 13$b$ will compensate the VSS voltage at each of the second wire segments 121$b$, that is, the second auxiliary electrode 13$b$ compensates for the VSS voltage input by the light-emitting units 11 corresponding to each of the second wire segments 121$b$, so as to compensate for the IR drop of the second power wires 12$b$ during the VSS signal transmission process, and the brightness uniformity of the display panel 100 is improved.

Specifically, the display panel 100 further includes a first power bus 161 and a second power bus 162 disposed on the substrate 10. The first power bus 161 is connected between the first driving chip 151 and the first power wires 12$a$, and is used to transmit the VDD signal in the first driving chip 151 to the first power wires 12$a$ and the first auxiliary electrode 13$a$. The first power bus 161 extends in a second direction Y. The second direction Y is perpendicular to the first direction X. A first connection wire 171 is connected between the first power bus 161 and the first auxiliary electrode 13$a$. The first connection wire 171 is used to transmit the VDD signal in the first power bus 161 to the first auxiliary electrode 13$a$. The first connection wire 171 extends along the first direction X. An orthographic projection of the first connection wire 171 on the plane of the substrate 10 is located between orthographic projection of adjacent first power wires 12 on the plane of the substrate 10.

The second power bus 162 is connected between the second driving chip 152 and the second power wires 12$b$, and is used to transmit the VSS signal in the second driving chip 152 to the second power wires 12$b$ and the second auxiliary electrode 13$b$. The second power bus 162 extends along the second direction Y. A second connection wire 172 is connected between the second power bus 162 and the second auxiliary electrode 13$b$. The second connection wire 172 is used to transmit the VSS signal in the second power bus 162 to the second auxiliary electrode 13$b$. The second connection wire 172 extends along the first direction X. The orthographic projection of the second connecting wire 172 on the plane of the substrate 10 is located between orthographic projection of adjacent second power wires 12$b$ other on the plane of the substrate 10.

In the embodiment, the display panel 10 further comprises a plurality of first auxiliary power wires 181 and a plurality of second auxiliary power wires 182 disposed on the substrate 10. A plurality of first the auxiliary power wires 181 intersect with a plurality of the first power wires 12$a$ to form a first mesh structure 21. The first wire segments 121$a$ is connected to the first auxiliary electrode 13$a$ in the area where the first auxiliary power wires 181 and the first power wires 12$a$ intersect. The first through hole 141$a$ is disposed in an area where the first auxiliary power wires 181 and the first power wires 12$a$ intersect. a plurality of the second auxiliary power wires 182 intersect with a plurality of the second power wires 12$b$ to form a second mesh structure 22. The second wire segments 121$b$ is connected to the second auxiliary electrode 13$b$ in an area where the second auxiliary power wires 182 and the second power wires 12$b$ intersect.

The second through hole 141$b$ disposed in an area where the second auxiliary power trace 182 and the second power wires 12$b$ intersect.

Figure 8A:
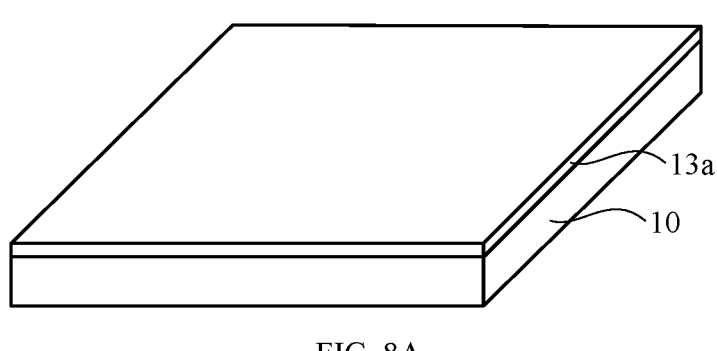

Please refer to FIG. 8A to FIG. 8F, the present application also provides a method for manufacturing the display panel 100 as described in the fourth embodiment, which includes the following steps:

B1: Providing a substrate 10, and a first auxiliary electrode 13$a$ is formed on the substrate 10, as shown in FIG. 8A.

Wherein, the substrate 10 is a glass substrate. The first auxiliary electrode 13$a$ may be a transparent electrode. The material of the first auxiliary electrode 13$a$ may be metal, such as one or more selected from copper, aluminum, silver, molybdenum, and titanium.

Figure 8B:
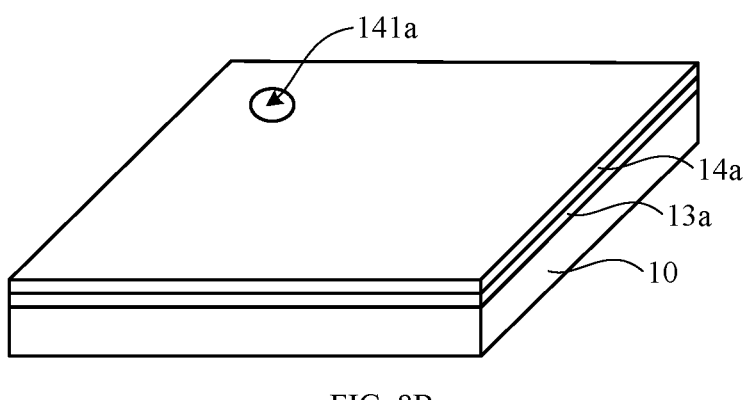

B2: Providing a first insulating layer 14$a$ on the first auxiliary electrode 13$a$, and a first through hole 141$a$ is disposed in the first insulating layer 14$a$, as shown in FIG. 8B.

Wherein, the first insulating layer 14$a$ is a planarization layer. A material of the first insulating layer 14$a$ may be an organic material, such as organic resin.

Figure 8C:
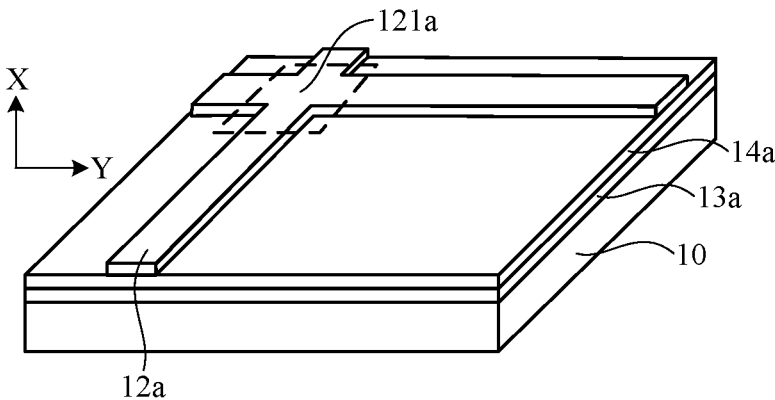

B3: Providing a first power wires 12$a$ on the first insulating layer 14$a$, as shown in FIG. 8C.

Figure 8D:
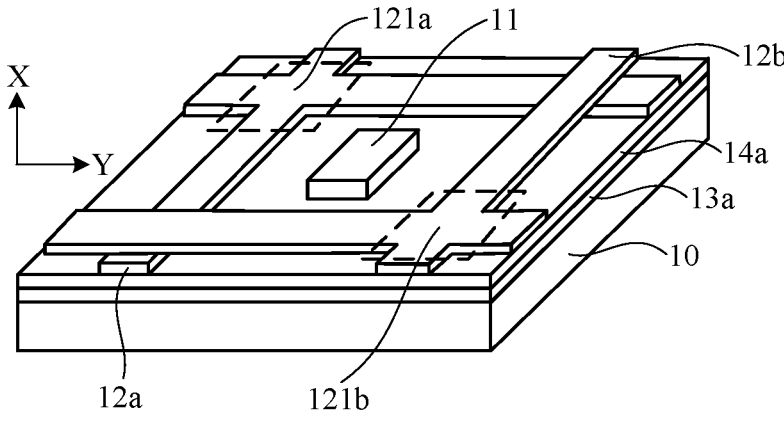

B4: Providing a second power wires 12$b$ on the first power wires 12$a$, as shown in FIG. 8D.

After the step B4, the step further includes: transferring the light-emitting units 11 to the substrate 10, connecting a VDD input terminal of the light-emitting units 11 to the first power wires 12$a$, and connecting a VSS input terminal of the light-emitting units 11 to the second power wires 12$b$ (not shown in the figures).

Figure 8E:
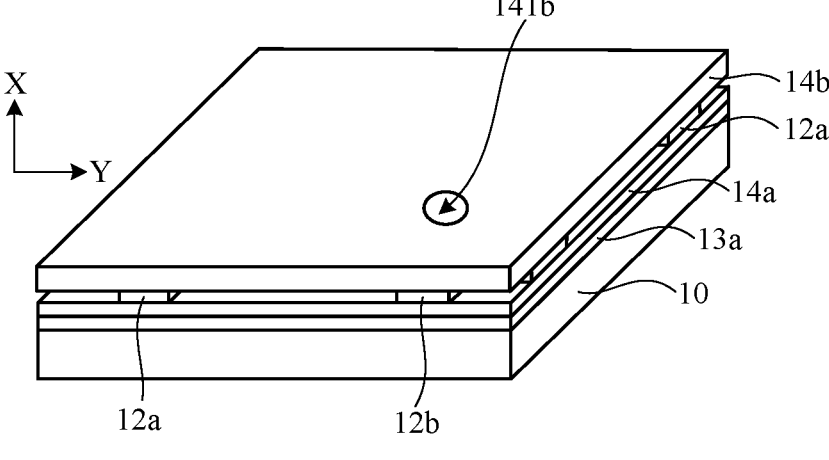

B5: Providing a second power wires 12$b$ on the second insulating layer 14$b$, and a second through hole 141$b$ is disposed in the second insulating layer 14$b$, as shown in FIG. 8E.

Wherein, the second insulating layer 14$b$ is a planarization layer. A material of the second insulating layer 14$b$ may be an organic material, such as organic resin.

Figure 8F:
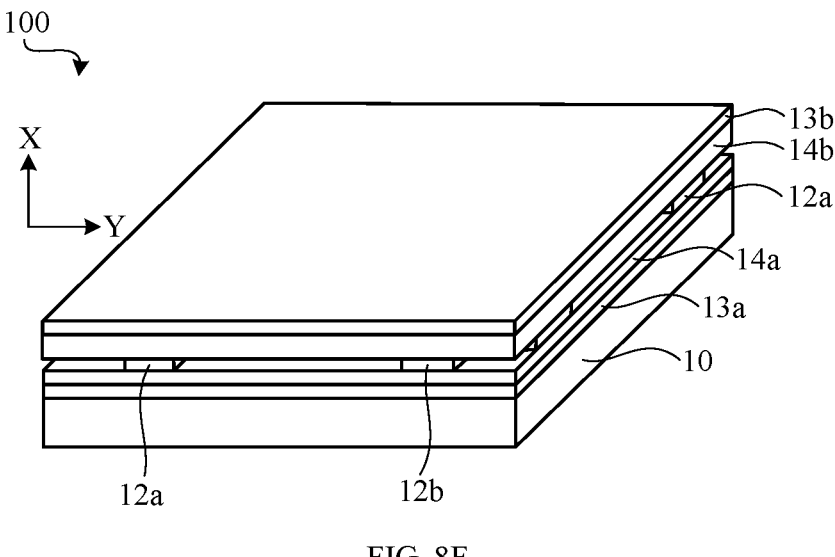

B6: Providing a second auxiliary electrode 13$b$ on the second insulating layer 14$b$, as shown in FIG. 8F.

Wherein, the second auxiliary electrode 13$b$ may be a transparent electrode. A material of the second auxiliary electrode 13$b$ may be metals, such as one or more selected from copper, aluminum, silver, molybdenum, and titanium.

Thus, the method for manufacturing of display panel 100 of this embodiment is completed.

It should be noted that, in the preparation process of the step B4 and the step B5, a step of forming a thin film transistor is also included, and the related technology and structure can refer to the current technology, which will not be repeated here. In addition, for the convenience of describing this embodiment, the above manufacturing method only illustrates the structure of one pixel area in the display panel 100, but this should not be understood as a limitation of the present application.

Since the manufacturing process of the first auxiliary electrode 13$a$ and the second auxiliary electrode 13$b$ in the embodiment can all adopt the manufacturing process of the existing display panel 100, the embodiment can improve the IR drop of the display panel without adding additional manufacturing processes, thereby improving the display quality of the display panel 100.

An embodiment of the present application also provides an electronic device. The electronic device may be a display device such as a mobile phone, a tablet, a notebook computer, and a TV. The electronic device includes a housing and a display panel disposed in the housing. The display panel may be the display panel 100 described in any of the foregoing embodiments. For the specific structure of the display panel 100, reference may be made to the description of the foregoing embodiment, which will not be repeated here.

The above describes in detail a display panel and an electronic device provided by the embodiments of the present application. Specific examples are used in the present application to illustrate the principles and implementation of this application. The descriptions of the above examples are only used to help understand the methods and core ideas of the present application; at the same time, according to the principles of the present application, those skilled in the art will have changes in the thinking, specific implementation and application scope. In summary, the content of this specification should not be construed as a limitation to the present application.

What is claimed is:

1. A display panel, comprising:
a substrate;
a plurality of light-emitting units disposed on the substrate;
a plurality of power wires disposed on the substrate, wherein the power wires extend in a first direction and are disposed between adjacent light-emitting units, and the power wires are connected to the light-emitting units; and
an auxiliary electrode disposed on a surface of the power wires close to or away from the substrate,
wherein the power wires comprise a plurality of wire segments, each of the wire segments corresponds to one of the light-emitting units, and each of the wire segments is connected to the auxiliary electrode; and in a top view of the display panel, orthographic projections of the power wires on the substrate are located within an orthographic projection of the auxiliary electrode on the substrate.

2. The display panel according to claim 1, wherein the display panel further comprises an insulating layer, the insulating layer disposed between the power wires and the auxiliary electrode, a through hole is disposed in the insulating layer, and the wire segments and the auxiliary electrode are connected in the through hole.

3. The display panel according to claim 2, wherein in the top view of the display panel, an opening area of the through hole gradually increases along the first direction.

4. The display panel according to claim 1, wherein the auxiliary electrode is configured as a whole layer without providing any opening.

5. The display panel according to claim 1, wherein the display panel further comprises a plurality of auxiliary power wires disposed on the substrate, and the plurality of auxiliary power wires intersect with the power wires to form a mesh structure, the wire segments and the auxiliary electrode are connected in an area where the auxiliary power wires and the power wires intersect.

6. The display panel according to claim 1, wherein the display panel further comprises a driving chip, the driving chip is connected to a surface of the substrate, and the power wires and the auxiliary electrode are both connected to the driving chip.

7. The display panel according to claim 6, wherein the power wires comprise a plurality of first power wires and a plurality of second power wires disposed on the substrate, the plurality of first power wires and the plurality of second power wires are disposed in different layers, the first power wires are located on a surface of the second power wires close to the substrate, and the first power wires and the second power wires both extend along the first direction and are disposed between adjacent light-emitting units;

the driving chip comprises a first driving chip and a second driving chip, the first driving chip and the second driving chip are both connected to a surface of the substrate; the auxiliary electrode comprises a first auxiliary electrode and a second auxiliary electrode disposed in different layers, the first auxiliary electrode is located between the substrate and the first power wires, and the second auxiliary electrode is located on a surface of the second power wires away from the substrate; the first power wires and the first auxiliary electrode are both connected to the first driving chip, the second power wires and the second auxiliary electrode are both connected to the second driving chip;
wherein the first power wires comprise a plurality of first wire segments, the second power wires comprise a plurality of second wire segments, and each of the first wire segments and each of the second wire segments are corresponding to one of the light-emitting units, and each of the first wire segments is connected to the first auxiliary electrode, and each of the second wire segments is connected to the second auxiliary electrode.

8. The display panel according to claim 7, wherein the display panel further comprises a first insulating layer and a second insulating layer, the first insulating layer is located between the first auxiliary electrode and the first power wire, and the second insulating layer is located between the second power wires and the second auxiliary electrode; and
a first through hole is disposed in the first insulating layer, and the first wire segments and the first auxiliary electrode are connected in the first through hole; a second through hole is disposed in the second insulating layer, the second wire segments and the second auxiliary electrode are connected in the second through hole.

9. The display panel according to claim 7, wherein the first power wires are positive polarity power wires, and the second power wires are negative polarity power wires; and/or
the display panel further comprises a plurality of first auxiliary power wires and a plurality of second auxiliary power wires disposed on the substrate; the plurality of first auxiliary power wires intersect with the plurality of the first power wires to form a first mesh structure, and the plurality of second auxiliary power wires intersect with the plurality of second power wires to form a second mesh structure.

10. The display panel according to claim 1, wherein the power wires comprise a plurality of first power wires and a plurality of second power wires disposed on the substrate, the plurality of first power wires and the plurality of second power wires are disposed in different layers, the first power wires are located on a surface of the second power wires close to the substrate, and the first power wires and the second power wires both extend along the first direction and are disposed between adjacent light-emitting units;
the display panel comprises a first driving chip and a second driving chip, the first driving chip and the second driving chip are both connected to a surface of the substrate; the auxiliary electrode comprises a first auxiliary electrode and a second auxiliary electrode disposed in different layers, the first auxiliary electrode is located between the substrate and the first power wires, and the second auxiliary electrode is located on a surface of the second power wires away from the substrate; the first power wires and the first auxiliary electrode are both connected to the first driving chip, the second power wires and the second auxiliary electrode are both connected to the second driving chip; and the first power wires comprise a plurality of first wire segments, the second power wires comprise a plurality of second wire segments, and each of the first wire segments and each of the second wire segments are corresponding to one of the light-emitting units, and each of the first wire segments is connected to the first auxiliary electrode, and each of the second wire segments is connected to the second auxiliary electrode; and an orthographic projection of the first auxiliary electrode on the plane where the substrate is located completely covers orthographic projections of the first power wires on the plane where the substrate is located, and an orthographic projection of the second auxiliary electrode on the plane where the substrate is located completely covers orthographic projections of the second power wires on the plane where the substrate is located.

11. The display panel according to claim 10, wherein in the top view of the display panel, orthographic projections of the first power wires on the substrate are located within an orthographic projection of the first auxiliary electrode on the substrate, and orthographic projections of the second power wires on the substrate are located within an orthographic projection of the second auxiliary electrode on the substrate.

12. The display panel according to claim 1, wherein in the top view of the display panel, the auxiliary electrode completely covers the power wires, and the auxiliary electrode is rectangular.

13. An electronic device, comprising a housing and a display panel disposed in the housing, and the display panel comprising:

a substrate;

a plurality of light-emitting units disposed on the substrate;

a plurality of power wires disposed on the substrate, wherein the power wires extend in a first direction and are disposed between adjacent light-emitting units, and the power wires are connected to the light-emitting units; and an auxiliary electrode disposed on a surface of the power wires close to or away from the substrate, wherein the power wires comprise a plurality of wire segments, each of the wire segments corresponds to one of the light-emitting units, and each of the wire segments is connected to the auxiliary electrode; and in a top view of the display panel, orthographic projections of the power wires on the substrate are located within an orthographic projection of the auxiliary electrode on the substrate.

14. The electronic device according to claim 13, wherein the display panel further comprises an insulating layer, the insulating layer disposed between the power wires and the auxiliary electrode, a through hole is disposed in the insulating layer, and the wire segments and the auxiliary electrode are connected in the through hole.

15. The electronic device according to claim 14, wherein in the top view of the display panel, an opening area of the through hole gradually increases along the first direction.

16. The electronic device according to claim 13, wherein the auxiliary electrode is configured as a whole layer without providing any opening.

17. The electronic device according to claim 13, wherein the display panel further comprises a plurality of auxiliary power wires disposed on the substrate, and the plurality of auxiliary power wires intersect with the power wires to form a mesh structure, the wire segments and the auxiliary electrode are connected in an area where the auxiliary power wires and the power wires intersect.

18. The electronic device according to claim 13, wherein the power wires comprise a plurality of first power wires and a plurality of second power wires disposed on the substrate, the plurality of first power wires and the plurality of second power wires are disposed in different layers, the first power wires are located on a surface of the second power wires close to the substrate, and the first power wires and the second power wires both extend along the first direction and are disposed between adjacent light-emitting units;

the display panel comprises a first driving chip and a second driving chip, the first driving chip and the second driving chip are both connected to a surface of the substrate, the auxiliary electrode comprises a first auxiliary electrode and a second auxiliary electrode disposed in different layers, the first auxiliary electrode is located between the substrate and the first power wires, and the second auxiliary electrode is located on a surface of the second power wires away from the substrate; the first power wires and the first auxiliary electrode are both connected to the first driving chip, the second power wires and the second auxiliary electrode are both connected to the second driving chip;

wherein the first power wires comprise a plurality of first wire segments, the second power wires comprise a plurality of second wire segments, and each of the first wire segments and each of the second wire segments are corresponding to one of the light-emitting units, and each of the first wire segments is connected to the first auxiliary electrode, and each of the second wire segments is connected to the second auxiliary electrode.

19. A display panel, comprising:

a substrate;

a plurality of light-emitting units disposed on the substrate;

a plurality of power wires disposed on the substrate, wherein the power wires extend in a first direction and are disposed between adjacent light-emitting units, and the power wires are connected to the light-emitting units;

an insulating layer disposed on a side of the power wires away from the light-emitting units; and an auxiliary electrode disposed on a side of the insulating layer away from the power wires, wherein the power wires comprise a plurality of wire segments, each of the wire segments corresponds to one of the light-emitting units, and each of the wire segments is connected to the auxiliary electrode; the insulating layer is provided with a plurality of through holes, and each of the wire segments is connected to the auxiliary electrode through one of the through holes; and the auxiliary electrode is provided with a plurality of openings, and one of the openings is disposed between two adjacent ones of the through holes.

20. The display panel according to claim 19, wherein in the top view of the display panel, an extension direction of the openings is perpendicular to the first direction, and a distance between two adjacent ones of the openings gradually increases along the first direction; and wherein the openings pass through the auxiliary electrode in a thickness direction of the display panel.

\* \* \* \* \*